(12) United States Patent
Wolf et al.

(10) Patent No.: US 10,290,987 B2
(45) Date of Patent: May 14, 2019

(54) LINEARLY MOVEABLE SLIDING CONTACT ELEMENT HAVING TRANSPORT DEVICE AND PRODUCTION METHOD

(71) Applicant: HARTING ELECTRONICS GMBH, Espelkamp (DE)

(72) Inventors: Torsten Wolf, Espelkamp (DE); Dieter Rose, Rahden (DE)

(73) Assignee: HARTING ELECTRONICS GMBH (DE)

( * ) Notice: Subject to any disclaimer, the term of this patent is extended or adjusted under 35 U.S.C. 154(b) by 0 days.

(21) Appl. No.: 16/069,148

(22) PCT Filed: Jan. 26, 2017

(86) PCT No.: PCT/DE2017/100049
§ 371 (c)(1),
(2) Date: Jul. 10, 2018

(87) PCT Pub. No.: WO2017/129179
PCT Pub. Date: Aug. 3, 2017

(65) Prior Publication Data
US 2019/0027878 A1    Jan. 24, 2019

(30) Foreign Application Priority Data
Jan. 29, 2016   (DE) .................. 10 2016 101 629

(51) Int. Cl.
*G01R 29/00* (2006.01)
*H01R 29/00* (2006.01)
(Continued)

(52) U.S. Cl.
CPC .......... *H01R 29/00* (2013.01); *H01R 12/714* (2013.01); *H01R 12/73* (2013.01);
(Continued)

(58) Field of Classification Search
CPC ..................................... H01R 29/00
See application file for complete search history.

(56) References Cited

U.S. PATENT DOCUMENTS 10,148,026 B2 * 12/2018 Pape ................... H01R 12/52
2018/0166808 A1   6/2018 Pape ................... H01R 12/714

FOREIGN PATENT DOCUMENTS

DE   102005035104   3/2006   ............ A61G 7/018
DE   102015110498   11/2016  ............ H01R 12/52
(Continued)

OTHER PUBLICATIONS

German Office Action (w/machine translation) issued in application No. 10 2016 101 629.2, dated Oct. 18, 2016 (11 pgs).
(Continued)

*Primary Examiner* — Ross N Gushi
(74) *Attorney, Agent, or Firm* — Hayes Soloway P.C.

(57) ABSTRACT

Disclosed is a linearly moveable sliding contact element having a transport device. Linearly moveable sliding contact elements of this type having a transport device are required to electrically contact conductor paths of circuit boards with one another, the circuit boards being oriented in parallel with one another and arranged above one another. In addition, the sliding contact element is arranged on a spindle of the transport device having an outer thread. Via a rotation of the transport device, the sliding contact element can be moved in a linear manner along the spindle by the outer thread. A first bearing and a second bearing are provided at the ends of the spindle. The bearings permit a mounting of the transport device between two circuit boards arranged in parallel with one another.

25 Claims, 4 Drawing Sheets

(51) Int. Cl.
*H01R 12/71* (2011.01)
*H01R 12/73* (2011.01)
*H01R 13/24* (2006.01)
*H01R 13/26* (2006.01)
*H01R 41/00* (2006.01)
*H01R 4/30* (2006.01)

(52) U.S. Cl.
CPC ......... *H01R 13/2435* (2013.01); *H01R 13/26* (2013.01); *H01R 41/00* (2013.01); *H01R 4/30* (2013.01)

(56) References Cited

FOREIGN PATENT DOCUMENTS

| EP | 2385404 | 11/2011 | ............... G02B 6/38 |
| GB | 2145581 | 3/1985 | ............... H01R 4/48 |
| WO | WO 2017000936 | 1/2017 | ............. H01R 12/52 |

OTHER PUBLICATIONS

International Search Report (w/translation) and Written Opinion (no translation) issued in application No. PCT/DE2017/100049, dated Apr. 28, 2017 (12 pgs).
International Preliminary Report on Patentability issued in application No. PCT/DE2017/100049, dated Aug. 9, 2018 (10 pgs).

\* cited by examiner

LINEARLY MOVEABLE SLIDING CONTACT ELEMENT HAVING TRANSPORT DEVICE AND PRODUCTION METHOD

BACKGROUND OF THE INVENTION

The invention relates to a linearly movable sliding contact element with transport device, having a base body, which forms the sliding contact element, and a spindle, which forms the transport device, wherein the base body has at least one receptacle in which an electrical contact may be received, wherein the electrical contact forms at least two contact regions, which project out of the base body at opposite sides of the base body, wherein the spindle has an elongated form and has an external thread, at least in certain regions, and wherein the base body has an internal thread into which the external thread of the spindle may be screwed. The invention furthermore relates to a method for the production of such a sliding contact element with transport device.

DE 10 2005 035104 C5 discloses a furniture drive having a displacement sensor. In this, an electromotive drive having an absolute displacement sensor is used, which may be adapted to the length of the adjustment travel and position information remains even in the event of a rapid release.

DE 10 2015 110 498 B3 discloses a sliding element for the contacting of printed circuit boards. In this, contacting of the conductor paths of two opposing printed circuit boards takes place.

Such linearly movable sliding contact elements with transport device are required for the mutual electrical contacting of conductor paths of mutually parallel-aligned printed circuit boards arranged above one another. In this case, the printed circuit boards are arranged at a very small spacing from one another and have a plurality of conductor paths whereof mutual contacting is required in different ways depending on the application and circuit.

Depending on the application, a plurality of conductor paths of the printed circuit boards can be connected simultaneously by a plurality of sliding contact elements. Through a displacement (sliding) of the sliding contact elements between the printed circuit boards, different positions, and therefore different electrical connections and circuits, can be closed. In this case, the sliding contact element contacts the two printed circuit boards between which it is arranged with an electrical contact. Therefore, en electrical connection is produced between the conductor path of the one printed circuit board and the conductor path of the other printed circuit board.

Fixed wiring or cabling is not expedient for such applications in a distributor box for telephone lines, for example, since the electrical connections have to be periodically altered, replaced and re-cabled. For this reason, conventional cabling with plug connectors and cables is very expensive. Each alteration requires a cable to be removed and a cable to be added and electrically connected at another point. This work requires an employee to go to the site of the corresponding distributor box in each case and carry out the new cabling manually. This is very time- and cost-intensive.

A further disadvantage of known cabling is the high spatial requirement. Since the cabling has to be implemented manually, a control box of this type requires a plug connector or at least one connection point for stranded conductors for every possible connection position. These are very large compared to the actual electrical lines which are to be connected to one another. Therefore, the installation space required for manual cabling is much greater than needed for the actual electrical contacting.

Devices of this type are required in particularly high quantities. For example, since each line connection of a telephone system requires contacting of a line comprising two wires, the total number of such contact elements in an automated exchange rapidly amounts to several thousand. Assembly of such a system is therefore very complex and expensive. In addition to short operating and assembly times, low unit costs should furthermore be considered as a factor for configuring a large number of such contact elements economically.

SUMMARY OF THE INVENTION

The object on which the invention is based, therefore, is to provide a linearly movable sliding contact element with transport device of the type described at the outset, which is notable for economical production and the capacity for rapid assembly, and also a suitable production method.

The invention relates to a linearly movable sliding contact element with transport device for the electrical contacting of conductor paths of opposing printed circuit boards. In this case, two printed circuit boards are arranged parallel to one another at a slight spacing. On the side facing the other printed circuit board in each case, electrical conductor paths are provided on the printed circuit boards. Depending on the application and the mutual circuitry of the two printed circuit boards, different opposing conductor paths provided on the printed circuit boards have to be electrically connected to one another.

The sliding contact element is formed from a base body which is provided for receiving at least one electrical contact. The base body is preferably produced from a polymer as a one-part injection molded part. The polymer is expediently electrically non-conductive, i.e. it is electrically insulating. The base body has at least one receptacle in which the at least one electrical contact can be inserted and fixed.

To enable the generic object to be achieved, the electrical contact is arranged in the base body such that it projects out of the base body at two opposite sides thereof. The electrical contact therefore forms two contact regions arranged outside the base body. The contact regions are provided for the electrical contacting of two printed circuit boards between which the sliding contact element is arranged.

A bore, which penetrates the base body completely, is provided in the base body. The bore is provided with an internal thread. According to the invention, the internal thread is formed merely as a first threaded segment. That is to say that the internal thread is only formed over 180° and not over the full 360° of the bore.

In a preferred embodiment, a first opening is provided in the base body, which opening is located opposite the first threaded segment. The first threaded segment is therefore accessible through the first opening in the base body. This is particularly advantageous for easy, economical production in an injection molding procedure. There is no need to manufacture a complex injection mold with movable individual parts. The use of a simple, two-part injection mold is possible owing to the first threaded segment which is accessible via the first opening.

A specific embodiment provides that two further, second openings are provided in the base body. In this case, the second openings are arranged before and after the first threaded segment, opposite the first opening in the base body. The second openings reach into the bore through the base body so production can be realized in a highly material-saving and economical manner by means of the second openings in the base body.

The transport device is likewise a component produced from a polymer, according to the invention in an injection molding procedure. The transport device has an elongated form and essentially forms a spindle which has an external thread over its length. A respective bearing is provided at the two ends of the spindle. The bearings are provided for receiving and mounting the transport device between two printed circuit boards.

A coupling is additionally provided on a first of the two bearings, on the side of the bearing which is remote from the external thread. In this case, the coupling can be expediently formed in different ways. It serves for coupling the transport device to a motor or to another device which enables the transport device to be set in rotation. The coupling is advantageously designed such that it can be actuated by means of a simple mechanism.

In a preferred embodiment, the external thread is formed merely as a second threaded segment in a delimited region on the second of the two bearings. The external thread is only present on one half of the spindle in this region. The other half of the spindle is designed to be smooth, without a thread. The external thread is therefore only present over 180° around the spindle in the delimited region.

The spindle and the external thread on the spindle are formed such that the spindle can be received in the sliding contact element. The external thread of the spindle may be screwed into the internal thread of the sliding contact element. The sliding contact element can therefore be moved linearly as a result of rotating the spindle. The transport device is configured such that it is able to move the sliding contact element linearly. The sliding contact element can be moved depending on the rotation of the transport device by means of a drive which rotates the transport device on the coupling.

A specific embodiment provides that the base body of the sliding contact element and the transport device are formed in one part and connected to one another via a web. This is particularly advantageous for producing both components in one injection molding procedure. The base body and the transport device can therefore be produced and transported in one part. The web is advantageously formed as a predetermined breaking point. The base body and the transport device can therefore be easily separated from one another. The electrical contacts can be inserted directly into the base body which is still connected to the transport device. This advantageously means that only one piece has to be order-picked.

A further advantage of the one-part production of the base body and transport device is that, during the production of the injection molds—which usually have several cavity pairs—the thread of the base body and transport device only have to be matched to one another in pairs in each case. If several base bodies and several transport devices were to be removed from an injection mold at the same time, all produced parts, i.e. primarily the threads, would have to fit one another and be compatible. As a result of the fact that base body/transport device pairs are always produced, only the respective threads have to be matched to one another. This reduces the production costs and complexity of the injection mold.

To assemble the linearly movable sliding contact element with transport device, the transport device merely has to be separated or broken off from the base body and inserted therein. Owing to the advantageous configuration of the thread, the transport device is already connected to the base body after a half rotation. The invention therefore enables easy, economical production, order-picking and assembly of the linearly movable sliding contact element with transport device.

DESCRIPTION OF THE DRAWINGS

An exemplary embodiment of the invention is illustrated in the drawings and will be explained in more detail below. The drawings show.

The figures contain partially simplified schematic illustrations. Identical reference signs are sometimes used for elements which are similar, but possibly not identical. Different view of similar elements can be drawn to different scales.

DETAILED DESCRIPTION OF THE INVENTION

Figure 1:
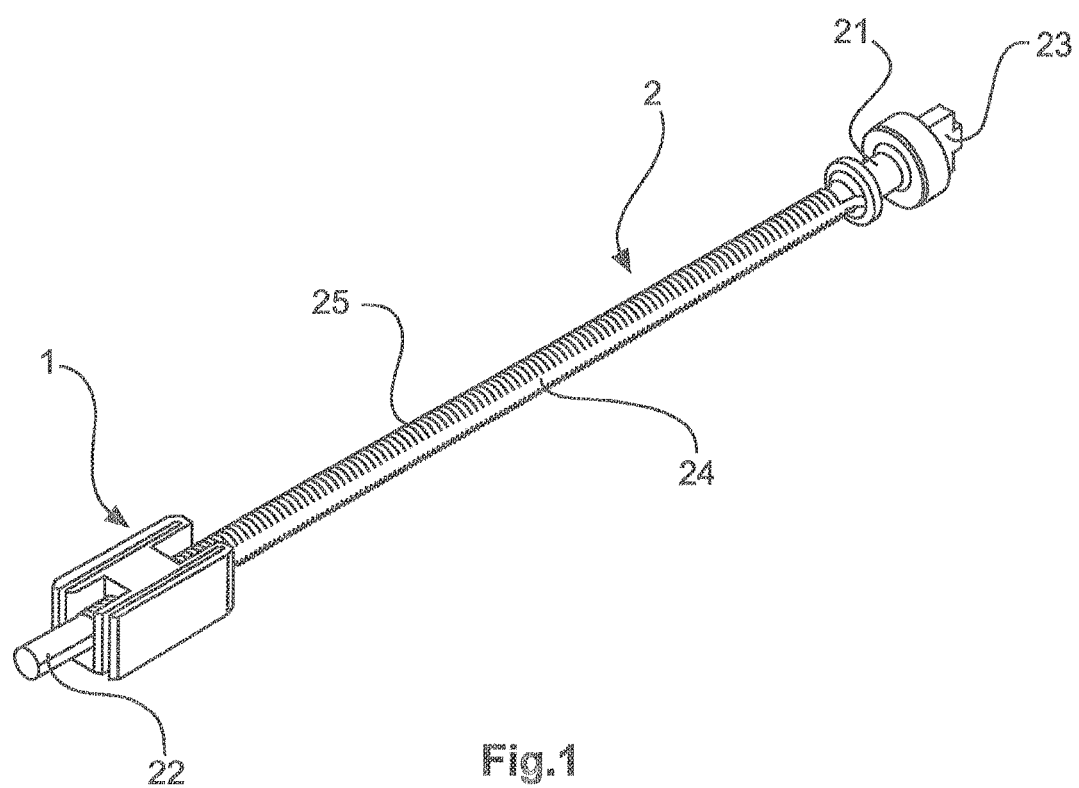
FIG. 1 a perspective illustration of a linearly movable sliding contact element with transport device.

FIG. 1 shows a perspective illustration of an inventive linearly movable sliding contact element 1 with transport device 2. The transport device 2 is designed as a spindle 24. The spindle 24 is designed as a cylindrical body and has a thread which is formed as an external thread 25 around the spindle.

The spindle 24 forms a first end and a second end, wherein the first end has a first bearing 21 and the second end has a second bearing 22. The bearings 21, 22 are provided for mounting the transport device 2 between two printed circuit boards. To this end, the bearings 21, 22 may be received in counter-bearings in which they are rotatably mounted.

At the first end, the spindle 24 has a coupling 23 terminating the transport device 2 behind the bearing 21. The coupling 23 is designed as an elongated pin. By means of a counter-coupling, the transport device can be rotated via the coupling 23.

The sliding contact element 1 is seated on the transport device 2 and fixed on the transport device 2 by means of an internal thread. The sliding contact element 1 can be moved linearly along the transport device 2 via a rotation of the transport device 2.

Figure 2:
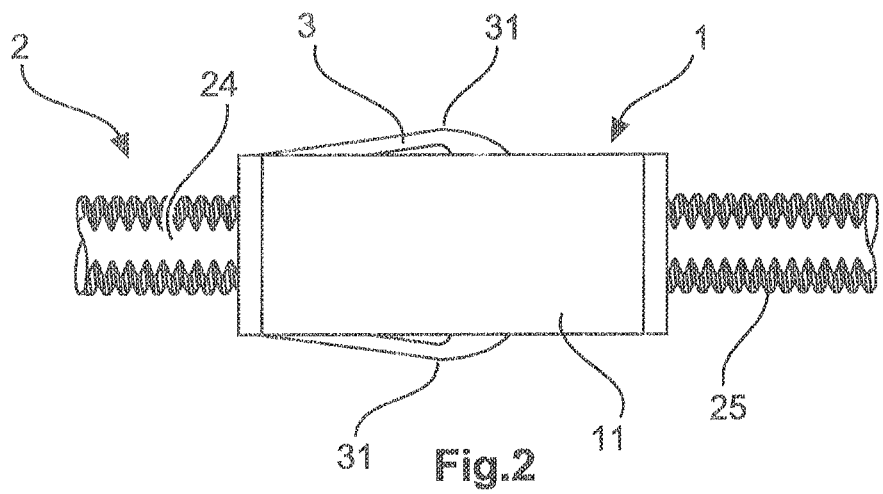
FIG. 2 a detailed view of a sliding contact element.

A detailed view of the sliding contact element 1 is illustrated in FIG. 2. The sliding contact element 1 is formed from a base body 11 which is seated and guided on the spindle 24. Two electrical contacts 3 are moreover received in the base body 11. The electrical contacts 3 are designed such that they form two contact regions 31. The contact regions 31 project out of the base body 11 at two opposite sides thereof. Two printed circuit boards, between which the sliding contact element 1 is arranged, can thus be electrically connected to one another.

Figure 3:
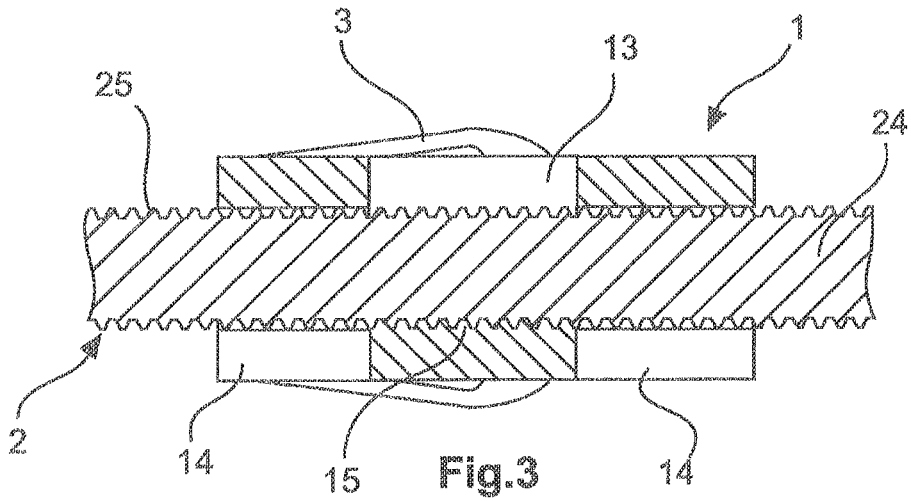
FIG. 3 a sectional illustration of a sliding contact element.

FIG. 3 shows the detailed view of FIG. 2 again in a sectional illustration. This shows the spindle 24 with the external thread 25, which extends through the base body 11 of the sliding contact element 1. An internal thread, into which the external thread 25 of the transport device is screwed, is integrally formed in the base body 11.

A first opening 13 is incorporated in the base body in the region of the internal thread. The first opening 13 reaches into the base body 11 to the extent that the internal thread is only formed as a threaded segment 15. The threaded segment 15 can thus be easily produced in an injection molding tool through the opening 13. Moreover, two second openings 14 are incorporated in the base body 11 to the sides of the threaded segment 15. The guide above the spindle 24 can likewise be produced by an injection molding tool through the openings 14. The openings 13, 14 therefore enable easy demolding of the base body 11 in an injection molding tool in one step.

Figure 4:
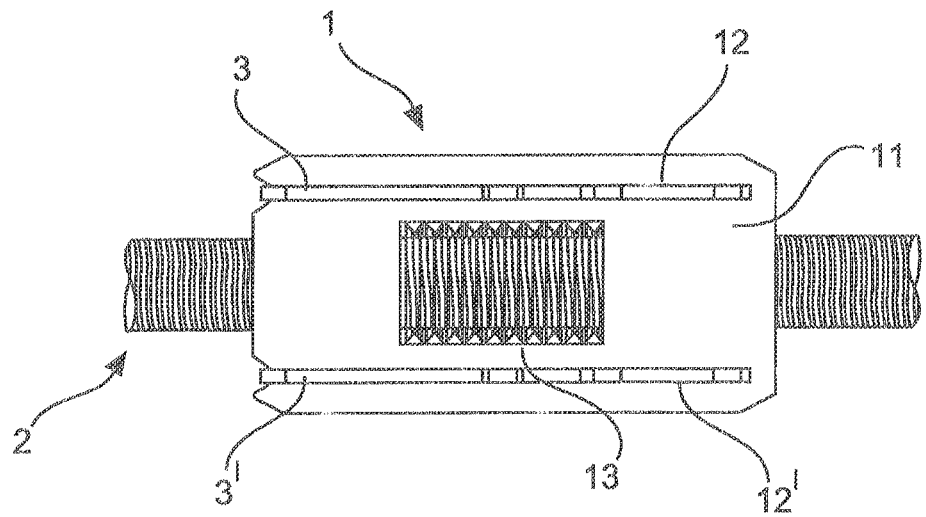
FIG. 4 a further detailed view of a sliding contact element.

A further detailed view of the sliding contact element 1 is illustrated in FIG. 4. The view of FIG. 4 is rotated through 90° with respect to the view of FIG. 2. This shows the opening 13 through which the external thread 25 of the spindle 24 can be seen.

On both sides of the opening 13 and the transport device 2, a respective receptacle 12 is integrally formed in the base body 11. Electrical contacts 3, 3' are received in the receptacles 12. In this case, the receptacles 12 are integrally formed as slots in the base body 11 so that the electrical contacts 3, 3' project out of the base body 11 with their contact regions 31 on both sides.

Figure 5:
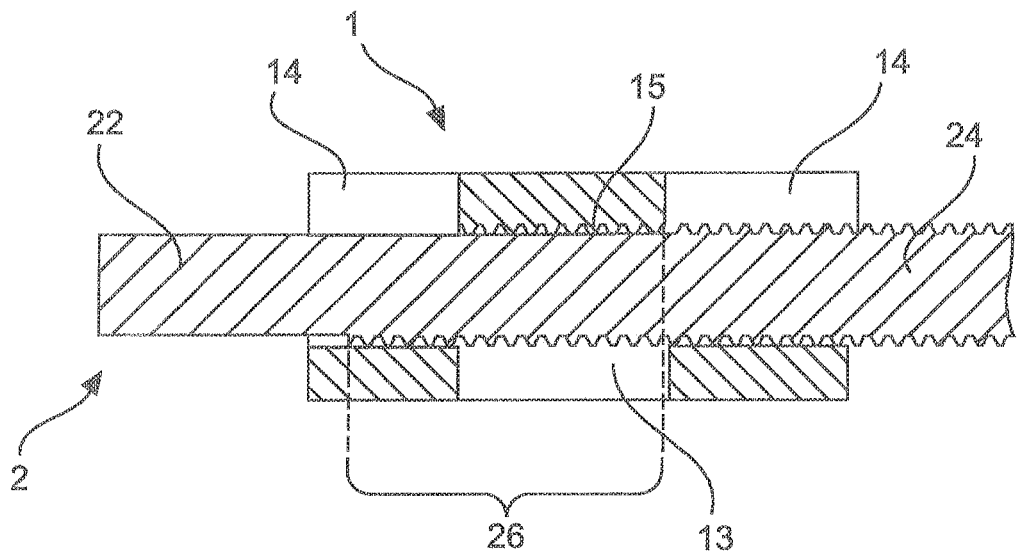
FIG. 5 a sectional illustration of a sliding contact element with transport device.

A sectional illustration of a sliding contact element with transport device is shown in FIG. 5. The external thread 25 is formed on the second bearing 22 as a second threaded segment in a region 26. That is to say that the external thread 25 in the region 26 is formed on only half the surface of the spindle —over 180° of the circumference.

As can be seen in FIG. 5, the half external thread 25 in the region 26, in combination with the first threaded segment 15 in the base body 11, serves for easy, rapid assembly of the sliding contact element 1 on the transport device 2. As a result of the two threads which are only formed over 180°, it is possible to push the spindle 24 so far into the base body 11 that the second bearing 22 already projects out of it. With a rotation of less than 360°, the two threads 15, already engage with one another and full functioning is realized.

Figure 6:
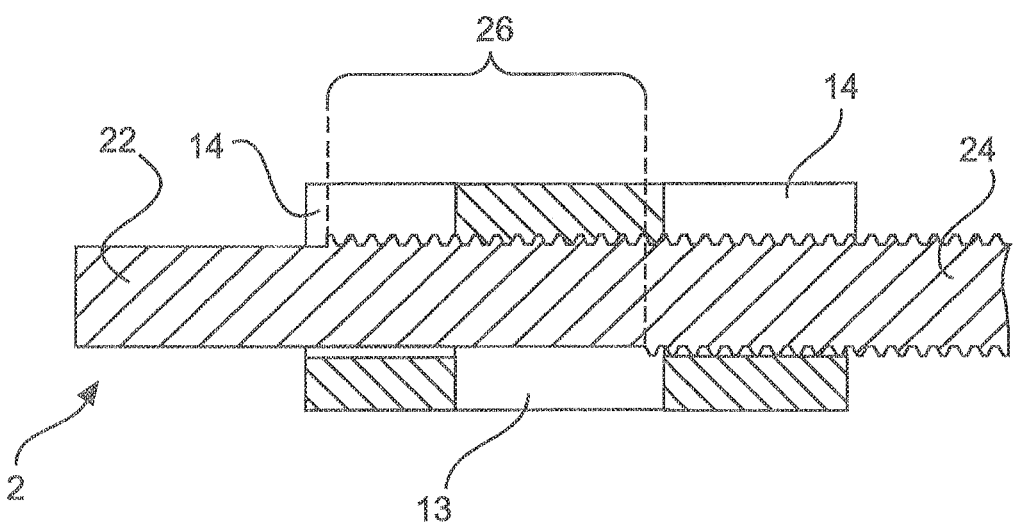
FIG. 6 a further sectional illustration of a sliding contact element with transport device.

The assembly in FIG. 5 is shown in FIG. 6 with a spindle 24 rotated through 180°. The threads 15, 25 already engage fully with one another here, although the transport device 2 has only been rotated through 180°. This enables easy, rapid assembly of the device and saves screwing the transport device 2 into the sliding contact element 1 through ca. 15 rotations.

Figure 7:
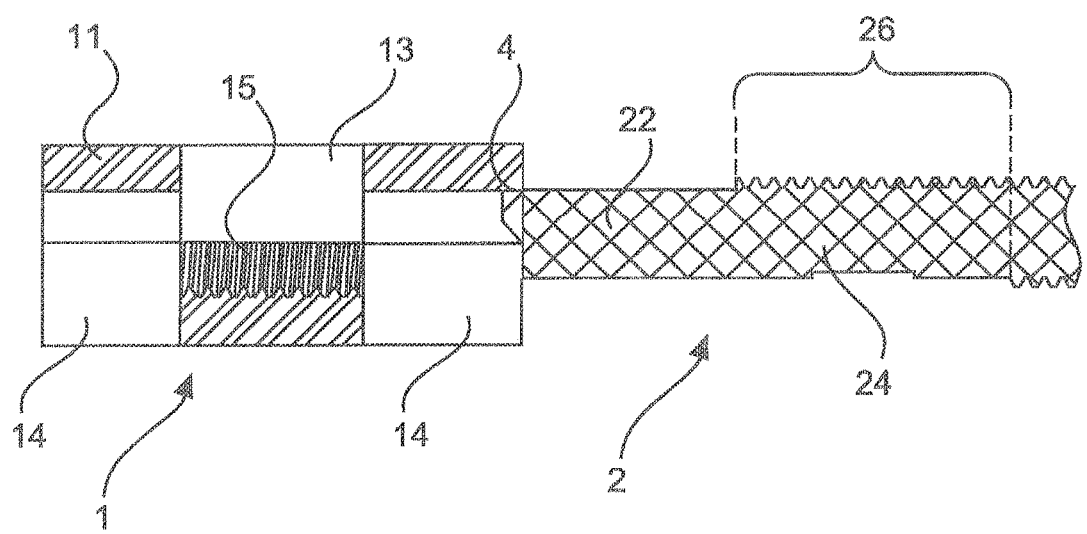
FIG. 7 a sectional illustration of a base body with a connected transport device.

FIG. 7 shows a sectional illustration of a base body 11 with the connected transport device 2. In this case, FIG. 7 represents the production status of the base body 11 and transport device 2. According to the invention, the base body 11 and the transport device 2 are produced in one part in an injection molding procedure. The base body 11 and transport device 2 are connected to one another via a web 4 to enable a one-part injection molding process.

The web 4 is expediently simultaneously formed as a predetermined breaking point. To assemble the device, two electrical contacts 3, 3' merely have to be inserted into the base body 1, the transport device 2 is separated from the base body 11, pushed therein and then rotated through 180°.

The invention claimed is:

1. A linearly movable sliding contact element with transport device for the contacting of two printed circuit boards, having a base body, which forms the sliding contact element, and a spindle, which forms the transport device, wherein the base body has at least one receptacle in which an electrical contact may be received, wherein the electrical contact forms at least two contact regions, which project out of the base body at opposite sides of the base body, wherein the spindle has an elongated form and has an external thread, at least in certain regions, and wherein the base body has a bore having an internal thread into which the external thread of the spindle may be screwed, wherein the internal thread in the base body is formed as a first threaded segment, in that the transport device has a first bearing at a first end of the spindle and a second bearing at a second end of the spindle, and in that, at the side aligned towards the second bearing, the external thread of the spindle is formed as a second threaded segment over a region, and the base body has a first opening on the side opposite the first threaded segment and wherein the first threaded segment and the second threaded segment are each divided into two or more angular regions, wherein the angular regions of the first threaded segment and the second threaded segment may be joined to one another.

2. The linearly movable sliding contact element with transport device as claimed in claim 1, wherein the first threaded segment is formed in an angular region between 45 degrees and 180 degrees of the bore.

3. The linearly movable sliding contact element with transport device as claimed in claim 2, wherein the base body has a second opening in at least one region near to the first threaded segment, wherein the at least one second opening is opposite the first opening.

4. The linearly movable sliding contact element with transport device as claimed in claim 1, wherein the first threaded segment is formed in an angular region between 90 degrees and 180 degrees.

5. The linearly movable sliding contact element with transport device as claimed in claim 4, wherein the base body has a second opening in at least one region near to the first threaded segment, wherein the at least one second opening is opposite the first opening.

6. The linearly movable sliding contact element with transport device as claimed in claim 1, wherein the base body has a second opening in at least one region near to the first threaded segment, wherein the at least one second opening is opposite the first opening.

7. The linearly movable sliding contact element with transport device as claimed in claim 6, wherein the base body has a second opening in at least one region near to the first threaded segment, wherein the at least one second opening is opposite the first opening.

8. The linearly movable sliding contact element with transport device as claimed in claim 1, wherein the transport device has a coupling on the side of the first bearing which is opposite the spindle.

9. The linearly movable sliding contact element with transport device as claimed in claim 1,
wherein
the second threaded segment is formed in an angular region between 180 degrees and 315 degrees around the spindle.

10. The linearly movable sliding contact element with transport device as claimed in claim 9,
wherein
a sum of angles of an annular region of the first threaded segment and of the second threaded segment is between 350 and 360 degrees.

11. The linearly movable sliding contact element with transport device as claimed in claim 1,
wherein
the base body is made from an electrically insulating polymer.

12. The linearly movable sliding contact element with transport device as claimed in claim 1,
wherein
the transport device is made from an electrically insulating polymer.

13. A method for producing a linearly movable sliding contact element with transport device as claimed in claim 1,
wherein
the base body and the transport device are connected to one another via a web in one-part injection molding procedure, and in that two electrical contacts are inserted into the base body, the transport device is separated from base body, pushed therein and then rotated through 180°.

14. The method as claimed in claim 13,
wherein
the web is produced as a predetermined breaking point.

15. A linearly movable sliding contact element with transport device for the contacting of two printed circuit boards,
having a base body, which forms the sliding contact element, and a spindle, which forms the transport device, wherein the base body has at least one receptacle in which an electrical contact may be received,
wherein the electrical contact forms at least two contact regions, which project out of the base body at opposite sides of the base body, wherein the spindle has an elongated form and has an external thread, at least in certain regions, and wherein the base body has a bore having an internal thread into which the external thread of the spindle may be screwed,
wherein
the internal thread in the base body is formed as a first threaded segment, in that the transport device has a first bearing at a first end of the spindle and a second bearing at a second end of the spindle, and in that, at the side aligned towards the second bearing, the external thread of the spindle is formed as a second threaded segment over a region, and the base body has a first opening on the side opposite the first threaded segment, and
wherein
the transport device is made from an electrically insulating polymer.

16. The linearly movable sliding contact element with transport device as claimed in claim 15,
wherein
the first threaded segment is formed in an angular region between 45 degrees and 180 degrees of the bore.

17. The linearly movable sliding contact element with transport device as claimed in claim 15,
wherein
the first threaded segment is formed in an angular region between 90 degrees and 180 degrees.

18. The linearly movable sliding contact element with transport device as claimed in claim 17,
wherein
the base body has a second opening in at least one region near to the first threaded segment,
wherein the at least one second opening is opposite the first opening.

19. The linearly movable sliding contact element with transport device as claimed in claim 15,
wherein
the base body has a second opening in at least one region near to the first threaded segment,
wherein the at least one second opening is opposite the first opening.

20. The linearly movable sliding contact element with transport device as claimed in claim 19,
wherein
the base body has a second opening in at least one region near to the first threaded segment,
wherein the at least one second opening is opposite the first opening.

21. The linearly movable sliding contact element with transport device as claimed in claim 19,
wherein
the base body has a second opening in at least one region near to the first threaded segment,
wherein the at least one second opening is opposite the first opening.

22. The linearly movable sliding contact element with transport device as claimed in claim 15,
wherein
the transport device has a coupling on the side of the first bearing which is opposite the spindle.

23. The linearly movable sliding contact element with transport device as claimed in claim 15,
wherein
the second threaded segment is formed in an angular region between 180 degrees and 315 degrees around the spindle.

24. The linearly movable sliding contact element with transport device as claimed in claim 23,
wherein
a sum of angles of an annular region of the first threaded segment and of the second threaded between 350 and 360 degrees.

25. The linearly movable sliding contact element with transport device as claimed in claim 15,
wherein
the base body is made from an electrically insulating polymer.

* * * * *